United States Patent [19]

Miyagi

[11] 4,020,704

[45] May 3, 1977

[54] PUSHBUTTON TUNER

[75] Inventor: Kiyosi Miyagi, Yokohama, Japan

[73] Assignee: Matsushita Electric Industrial Co., Ltd., Osaka, Japan

[22] Filed: June 6, 1975

[21] Appl. No.: 584,357

[30] Foreign Application Priority Data

June 10, 1974 Japan .............................. 49-66409

[52] U.S. Cl. .............................. 74/10.33; 74/10.27; 74/10.29; 74/10.35

[51] Int. Cl.² ........................................ F16H 35/18

[58] Field of Search ........... 74/10.33, 10.31, 10.29, 74/10.27, 10.35

[56] References Cited

UNITED STATES PATENTS

| | | | |
|---|---|---|---|
| 2,318,554 | 5/1943 | Raney | 74/10.29 |
| 2,319,472 | 5/1943 | Plensler | 74/10.33 |
| 2,344,091 | 3/1944 | Kirk | 74/10.33 |
| 3,602,051 | 8/1971 | Olah | 74/10.35 |

Primary Examiner—Samuel Scott
Assistant Examiner—Randall Heald

Attorney, Agent, or Firm—Stevens, Davis, Miller & Mosher

[57] ABSTRACT

A pushbutton tuner for a radio receiver such as an auto radio has a pair of turn plates rotatable about axes and first and second link members extending between and pivotally connected to said first and second turn plates to form a link work. An auxiliary link member is pivotally connected to each of said first and second turn plates at a point coincident with the apex of a triangle having its bottom side formed by a line joining the points at which each turn plate is pivotally connected to said first and second link members. Pushbuttons are mounted on pushbutton stems which carry regulating segments which, when the pushbuttons are pushed, are urged against the first and second link members to move the same so that the first and second turn plates are rotated. Variable elements are operatively connected to the first and second turn plates and are movable relative to turning elements when the first and second turn plates are rotated whereby a tuned state is obtainable.

5 Claims, 7 Drawing Figures

PUSHBUTTON TUNER

The present invention relates to a pushbutton tuner for a radio receiver such as an auto radio.

Pushbutton tuners of the type specified are disclosed in Japanese Patent Publication Nos. 47-34482, 47-34483, 47-34486 and 47-44281 all in the name of Nippon Technical Kabushiki Kaisha. Each of the tuners of the class had link members operatively connected to form a link work. The link work was operatively associated with pushbuttons so that variable elements associated with tuning elements are moved relative to the tuning elements when the pushbuttons are pushed. In addition, a rotary tuning mechanism was provided for the rotary tuning of an associated radio receiver.

With the prior art pushbutton tuner, however, the link work failed to smoothly operate. The joints between respective link members and between some of the link members and the pushbuttons caused lost motion and produced chattering. In addition, the rotary tuning mechanism was not operatively connected to the pushbutton tuning mechanism in such a manner as to prevent substantial lost motion of the pushbuttons.

The present invention aims to eliminate the problems of the prior art.

According to the present invention, there is provided a pushbutton tuner comprising at least one tuning element, first and second members rotatable about axes, respectively, first and second link members each extending between said first and second rotatable members and having opposite ends pivotally connected thereto, an auxiliary link member interconnecting said first and second rotatable members to form a link work together with said first and second link members and rotatable members, said auxiliary link member being pivotally connected to each of said first and second rotatable members at a point positioned at the apex of a triangle having its bottom side formed by a line joining the points at which said first and second link members are pivotally connected to each rotatable member, at least one pushbutton, a stem carrying said pushbutton, a regulating member carried by said stem and having portions adapted to be urged against said first and second link members when said pushbutton is pushed thereby to move said first and second link members and correspondingly rotate said first and second rotatable members, and at least one variable element operatively connected to said link work and movable relative to said tuning element when said pushbutton is pushed whereby a tuned state is obtained.

The present invention will be described by way of example with reference to the accompanying drawings.

Figure 1:
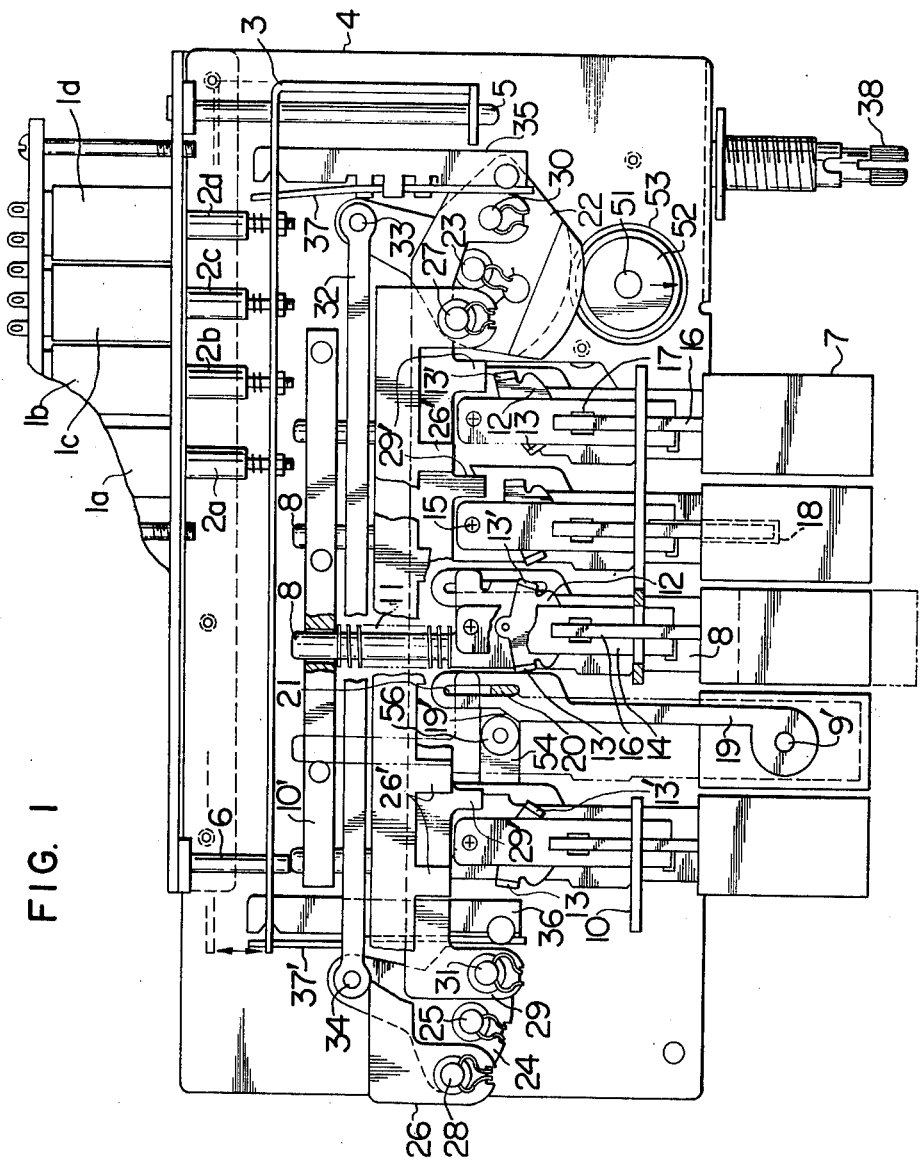
FIG. 1 is a top plan view of an embodiment of the pushbutton tuner according to the present invention.

The pushbutton tuner of the present invention includes a plurality of tuning elements 1a to 1d mounted on a base 4 along the rear edge thereof. Variable elements 2a to 2d, which are slidable within the respective tuning elements, are secured to a variable element mounting bar 3 which is slidable on a pair of spaced and parallel guide rods 5 and 6 secured to the base 4.

Figure 2:
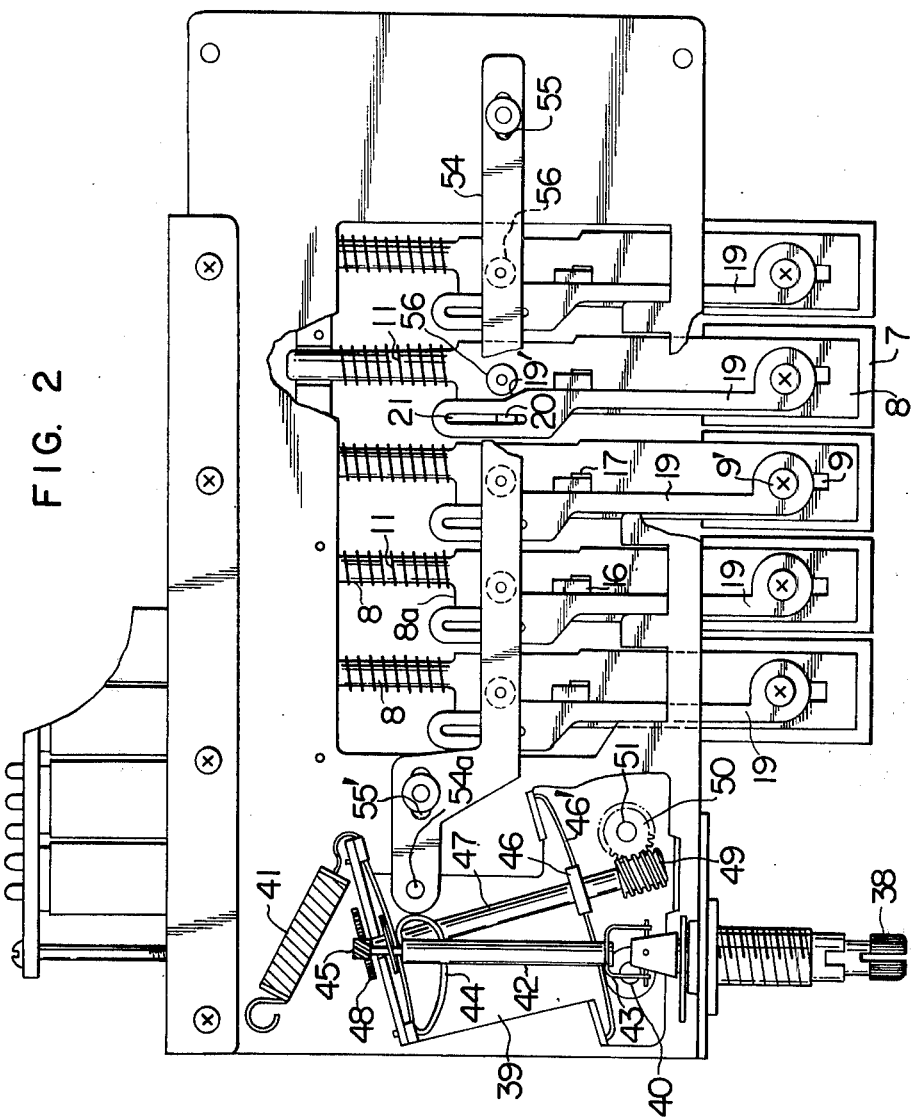
FIG. 2 is a bottom view of the tuner shown in FIG. 1.

A plurality of pushbuttons, one of which is designated by 7, are disposed in a row along the front edge of the base 4. As will be seen in FIG. 2, each of the pushbuttons 7 is mounted on a pushbutton stem 8 by means of a screw 9' extending into the pushbutton through a clutch release bar member 19 and a slot 9 formed in the stem 8 so that the pushbutton 7 is movable together with the bar member 19 and the screw 9' relative to the stem 8 to a position shown by a broken line (FIG. 1). Each of the pushbutton stems 8 is supported by a pair of front and rear bearings 10 and 10' so that the stem 8 is axially slidable through the bearings. A compression coil spring 11 extends around the part of each stem 8 which extends between the rear bearing 10' and a shoulder 8a formed on the stem, as shown in FIG. 2.

Figure 3:
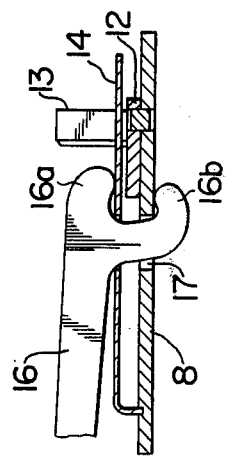
FIG. 3 is a partially sectional fragmentary view illustrating a button stem, a regulating segment, a regulating segment retainer and a holder for securing the members together.

A segment 12 having turned lugs 13 and 13' at the opposite sides is rotatably mounted at the center of the arc of the segment on a pushbutton stem 8 substantially at its intermediate portion. Respective segments 12 are mounted on respective stems 8 at different angles, as shown in FIG. 1. The purpose for the segments 12 will be made apparent later. A segment retainer 14 has its one end secured to one of the pushbutton stems 8 by means of a screw 15, the other end of the retainer 14 being embedded into and secured to the stem 8 as best seen in FIG. 3. A holder 16 having an outer end fitted into an axial slot 18 (FIG. 1) formed in each of the pushbuttons 7 has a forked inner end, as shown in FIG. 3. One of the legs 16a of the forked end extends over the segment retainer 14, while the other leg 16b extends downwardly through aligned holes 17 in the retainer 14 and the pushbutton stem 8 to cooperate with the one leg 16a to secure the stem 8, the segment 12 and the segment retainer 14 together. When the corresponding pushbutton 7 is outwardly moved relative to the stem 8 to the broken line position shown in FIG. 1, the segment 12 will be freely rotatable within a limited range relative to the stem 8 and the retainer 14.

The clutch release bar member 19 is secured at one end to each pushbutton 7 by a screw 9', as described above, for movement with the pushbutton and has the other or inner end which is laterally offset from the remaining part of the member 19 to provide an inclined cam surface 19'. FIG. 2 shows all of the clutch release bar members 19, while FIG. 1 illustrates only a part of the members. Each clutch release bar member 19 has a slot 21 formed in the offset inner end portion into which slot a part 20 of the corresponding pushbutton stem 8 extends.

A first turn plate 22 is disposed adjacent one of the side edges of the base 4 and is rotatably mounted thereon by a pivot pin 23. A second turn plate 24 is disposed adjacent the other side edge of the base 4 and is similarly rotatably mounted thereon by means of a pivot pin 25. A generally comb-shaped first link member 26 having projections 26' extending towards the pushbuttons 7 extends between the first and second turn plates 22 and 24 and has one end pivotally connected by a pin 27 to a laterally inner portion of the first turn plate 22, the other end of the first link member 26 being pivotally connected by a pin 28 to a laterally outer portion of the second turn plate 24. The arrangement is such that when a pushbutton 7 is pushed axially thereof, one of the lugs 13 of the corresponding segment 12 is urged against one of the projections 26' of the link member 26.

A generally comb-shaped second link member 29 having projections 29' extending towards the pushbuttons 7 is disposed beneath the first link member 26 and extends between the first and second turn plates 22 and 24. The second link member has its one end pivotally connected by a pin 30 to a laterally outer portion of the first turn plate 22. The other end of the second link member is pivotally connected to a laterally inner portion of the second turn plate 24 by a pin 31. The second link member 29 is so arranged with respect to the segments 12 that when a pushbutton 7 is axially pushed, the lug 13' of the corresponding segment 12 is moved into engagement with the corresponding projection 29' of the second link member 29.

It will be noted that the first and second turn plates 22 and 24 and the first and second comb-shaped link members 26 and 29 form a link work. An auxiliary or third link member 32 is provided between the first and second turn plates 22 and 24 and pivotally connected thereto by pins 33 and 34. The pin 33 is disposed at the apex of a triangle having its bottom side formed by a line joining the axes of the pins 27 and 30, whereas the pin 34 is disposed at the apex of a triangle having its bottom side formed by a line joining the axes of the pins 28 and 31. The auxiliary link member 32 is operative to make smooth the motion of the link work.

Transmission bars 35 and 36 are pivotally connected at one ends to the laterally outer and inner end portions of the first and second turn plates 22 and 24, respectively, and extend through slots (not shown) formed in the variable element mounting bar 3. Rods 37 and 37' formed of lengths of piano wire engage the transmission bars 35 and 36 with the variable element mounting bar 3 and the first and second turn plates 22 and 24, respectively.

Figure 4:
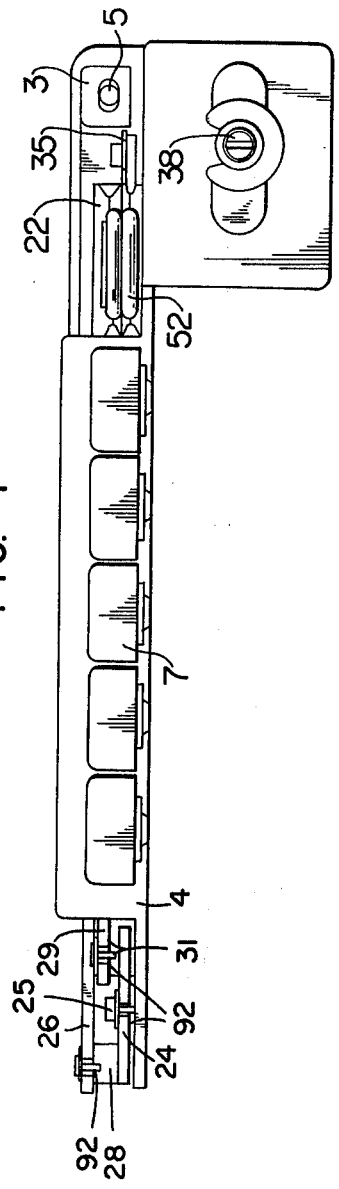
FIG. 4 is a front elevation of the tuner shown in FIGS. 1 and 2.

A rotary tuning shaft 38 is rotatably mounted on the base 4 at the front edge thereof and extends forwardly therefrom parallel to the pushbuttons. A rotary tuning mechanism mounting plate 39 is mounted on the base 4 for pivotal movement about a pin 40, as will be seen in FIG. 2. The plate 39 is biased normally leftwards as viewed in FIG. 2 by a tension spring 41. A flexible or universal joint 43 interconnects the inner end of the rotary tuning shaft 38 and one end of a transmission shaft 42 having its other end extending through a slot formed in an upstanding turned end portion of the mounting plate 39. A spring 44 supports the other end of the shaft 42. A gear 45 is secured to the other end of the shaft 42 and is in meshing engagement with a second gear 48 secured to one end of a driving shaft 47 extending through and supported by an intermediate bearing 46 which is turn is secured to a spring 46' extending between and secured to lugs on the opposite sides of the mounting plate 39. A worm 49 is secured to the other end of the driving shaft 47 and is in meshing engagement with a gear 50 which is rotatably mounted on the mounting plate 39 by means of a shaft 51 and which is connected to a disc member 52 shown in FIG. 1. As will be seen in FIG. 4, the peripheral surface of the disc member 52 is formed therein with an annular groove of V-shaped section which normally engages a V-shaped annular groove formed in a part of the periphery of the first turn plate 22. The disc member 52 is loosely accomodated by a hole 53 formed in the base 4 and having a diameter larger than that of the disc member.

An elongated control bar 54 (FIG. 2) extends laterally across the clutch release bar members 19 and is loosely connected to the base 4 by means of headed fasteners extending into the base through slots 55 and 55' formed in the opposite end portions of the bar 54. The latter is also pivotally connected at one end to the rotary tuning mechanism mounting plate 39 by a pin 54a. Cam followers in the form of rollers 56 are rotatably mounted on the upper surface of the control bar 54. The arrangement is such that, when a pushbutton 7 is pushed, the inclined cam surface 19' of the corresponding clutch release bar member 19 is moved into rolling engagement with the corresponding roller 56 to move the control bar 54 rightwards as viewed in FIG. 2 with the result that the rotary tuning mechanism mounting plate 39 is rotated clockwise (in FIG. 2) about the axis of the pin 40.

Figure 5A:
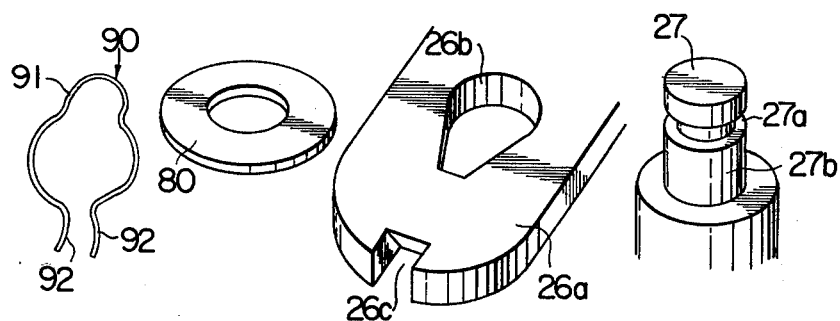
FIG. 5A illustrates in perspective views a pivot pin, a part of a mechanical element of the tuner, a washer and a resilient retainer both for securing the pin and the mechanical element together, the members being shown in disassembled position.
Figure 5B:
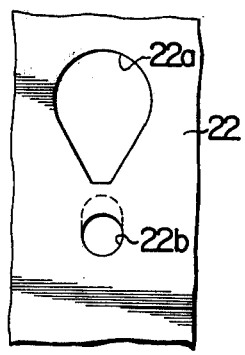
FIG. 5B is a fragmentary plan view of another machine element illustrating holes formed therein for receiving a pivot pin and a resilient retainer.
Figure 5C:
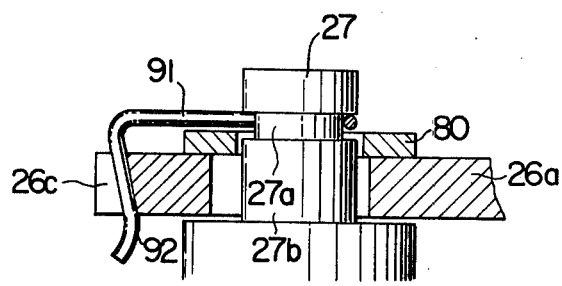
FIG. 5C illustrates partially in section the members shown in FIG. 5A, in their assembled position.

With reference to FIGS. 5A and 5C, the pin 27 which pivotally connects one end 26a of the comb-shaped first link member 26 to the first turn plate 22 has an end portion 27b of a diameter smaller than that of the remaining portion thereof. An annular groove 27a is formed in the peripheral surface of the portion 27b. The end 26a of the link member 26 is formed with a generally egg-shaped slot or through-hole 26b which is formed by a semi-circle and a trapezoid with its wider bottom side connected to the semi-circle. A cutout 26c is formed at the tip of the end 26a adjacent the trapezoid. As shown in FIG. 5A, the inner wall of the cutout 26c is inclined downwardly and inwardly for the reason to be made apparent later.

In the assembled position of the pin 27 and the link member 26, the end portion 27b of the pin 27 extends through the slot 26b in the link member end 26a. A washer 80 surrounds that part of the pin portion 27b which extends beyond the link member end 26a. A retainer in the form of a spring 90 having a looped end 91 and turned ends 92 is used to secure the pin 27, the link member end 26a and the washer 80 together. The looped end of the spring 90 is snapped into the annular groove 27a in the pin portion 27b. The turned ends 92 of the spring 90 are engaged with the inner wall of the cutout 26c to resiliently urge the pin 27 against the side walls of the trapezoidal part of the slot 26b.

Pins 23, 25, 28, 30 and 31 have structures similar to the structure of the pin 27 shown in FIGS. 5A and 5C. In addition, the other end of the link member 26 and the ends of the second link member 29 are formed therein with slots and cutouts similar to those shown in FIGS. 5A and 5C.

Referring to FIG. 5B, the first turn plate 22 is formed with a slot or through-hole 22a which is similar in shape to the slot 26b. The small diameter end portion of the pin 23 extends through the slot 22a and through a washer and a retainer similar to those shown in FIGS. 5A and 5C. In the case of the turn plate 22, however, a hole 22b is formed to receive turned ends of the retainer. The second turn plate 24 is also formed with similar slot and hole through which the pin 25 and the turned ends of an associated retainer extend, respectively.

It will be appreciated that each of the pins is resiliently urged by a retainer 90 into intimate contact with the side walls of the trapezoidal part of the slot 26b in the end of each comb-shaped link member 26 or 29 or the slot 22a in the turn plate 22 or 24 to assure smooth relative angular movement between associated parts and prevent the chattering which otherwise would be caused.

In operation, if the right-most pushbutton 7 is depressed, its stem 8 is inwardly moved against the corresponding spring 11 to urge the right hand lug 13' of the corresponding segment 12 against the corresponding projection 29' of the second comb-shaped link member 29 with the result that the first and second turn plates 22 and 24 are rotated about the axes of the pins 23 and 24, respectively, in counterclockwise direction as viewed in FIG. 1. The rotation of the turn plates 22 and 24 causes the first comb-shaped link member 26 to move forward, i.e., toward the pushbuttons 7, so that the left hand lug 13 of the segment 12 associated with the right-most pushbutton 7 is engaged by the corresponding projection 26' of the second comb-shaped link member 26 to prevent any further rearward or inward movement of the right-most pushbutton 7. In other words, the right-most pushbutton 7 and its stem 8 can be moved inwardly until both lugs 13 and 13' of associated segment 12 are engaged by the corresponding projections 29' and 26' of the comb-shaped link members 29 and 26.

The rotation of the first and second turn plates 22 and 24 also moves the transmission bars 35 and 36 a distance corresponding to the angle over which the first and second turn plates are rotated with the result that the variable element mounting bar 3 is correspondingly moved to move the variable elements 2a to 2d rearwardly relative to the tuning elements 1a to 1d.

On the other hand, if the left-most pushbutton 7 is pushed, the left hand lug 13 of the corresponding segment 12 is urged against the corresponding projection 26' of the first comb-shaped link member 26, so that the first and second turn plates 22 and 24 are rotated clockwise as viewed in FIG. 1 until the right hand lug 13' of the segment 12 is engaged by the corresponding projection 29' of the second comb-shaped link member 29. The clockwise rotation of the first and second turnplates 22 and 24 causes the variable elements 2a to 2d to move forwardly, i.e., toward the pushbuttons 7, relative to the tuning elements 1a to 1d. It will be understood that the segments 12 mounted on respective pushbutton stems 8 at different angles operate to regulate the angle over which the first and second turn plates 22 and 24 are rotated and, thus, the distance through which the transmission bars 35 and 36 are moved. It will also be appreciated that the auxiliary or third link member 32 facilitates smooth angular motion of the first and second turn plates 22 and 24 relative to the comb-shaped first and second link members 26 and 29. The arrangement of the pivot pins and the associated components shown in FIG. 5A to 5C also contributes to the smooth link motion and prevents chattering and lost motion.

When any one of the pushbuttons 7 is pushed to rearwardly move the corresponding pushbutton stem 8 and the clutch release bar member 19, the inclined cam surface 19' on the bar member 19 is moved into rolling engagement with the corresponding roller 56 on the control bar 54 to move the same rightwards as viewed in FIG. 2, so that the rotary tuning mechanism mounting plate 39 is rotated about the axis of the pin 40 in clockwise direction as viewed in FIG. 2 with the result that the disc member 52 shown in FIG. 1 is moved in a direction indicated by an arrow shown in FIG. 1 and, thus, is disengaged from the first turn plate 22. The disc member 52 is reengaged with the first turn plate 22 when the pushbutton stem 8 is returned to its initial position by the associated spring 11.

When it is desired to reset one of the segments 12 on the associated pushbutton stem 8, the rotary shaft 38 of the rotary tuning mechanism may be rotated until the first and second link members 26 and 29 are moved to predetermined positions. The corresponding pushbutton 7 will then be moved to the position shown by the broken lines in FIG. 1 to cause the segment holder 16 to release the retainer 14 for thereby allowing the segment 12 to be freely rotatable relative to the pushbutton stem 8. With the segment 12 being in this freely rotatable position, the pushbutton stem 8 will be moved inwardly or rearwardly until the right and left hand lugs 13' and 13 of the segment 12 respectively abut against the corresponding projections 26' and 29' of the first and second link members 26 and 29 located in the above-mentioned predetermined positions. At this time the segment holder 16 is moved to its initial operative position to secure the segment 12, the segment retainer 14 and the pushbutton stem 8 together in the manner shown in FIG. 3. When the lugs 13 and 13' of the segment 12 engage the first and second link members 26 and 29, the control bar 54 is moved for the first time by the clutch release bar member 19 to momentarily disengage the disc 52 from the first turn plate 22.

The control bar 54 provided with rollers 56 and extending between the front and rear rows of bearings 10 and 10' engages the clutch release bar members 19 on respective pushbutton stems 8 to smoothly guide the stems and prevent chattering. In addition, because the disc member 52 is not disengaged from the first turn plate 22 before the lugs 13 and 13' of segments 12 on the pushbutton stems 8 are engaged with the first and second link members 26 and 29, the segments 12 are advantageously prevented from being angularly displaced from their set positions.

What we claim is:

1. A pushbutton tuner comprising at least one tuning element, first and second members rotatable about axes, respectively, first and second link members each extending between said first and second rotatable members and having opposite ends pivotally connected thereto, an auxiliary link member interconnecting said first and second rotatable members to form a link work together with said first and second link members and rotatable members, said auxiliary link member being pivotally connected to each of said first and second rotatable members at a point positioned at the apex of a triangle having its bottom side formed by a line joining the points at which said first and second link members are pivotally connected to each rotatable member, at least one pushbutton, a stem carrying said pushbutton, a regulating member carried by said stem and having portions adapted to be urged against said first and second link members when said pushbutton is pushed thereby to move said first and second link members and correspondingly rotate said first and second rotatable members, at least one variable element operatively connected to said link work and movable relative to said tuning element when said pushbutton is pushed whereby a tuned state is obtained, pins secured to said first and second rotatable members to pivotally connect said first and second rotatable members to said first and second link members, each of said pins having a groove formed therein, said first and second link members being formed therein with through-holes each formed by a circular portion and non-circular portion, each of said pins extending through each of said through-holes, and a resilient retainer having an end portion engaged with the groove in each of said pins and urging the non-circular portion of the associated through-hole against the pin.

2. A pushbutton tuner according to claim 1, further including first and second bearings supporting said stem at spaced points along the length thereof, a rotary tuning mechanism including a rotary tuning shaft and a disc member rotatable by said tuning shaft and normally engaging one of said first and second rotatable members, a clutch release member carried by said stem, a control member disposed between said first and second bearings and operatively connected to said rotary tuning mechanism, said control member also being operatively associated with said clutch release member so that said disc is disengaged from said one rotatable member when said pushbutton is pushed.

3. A pushbutton tuner comprising a plurality of tuning elements mounted on said base, a row of a plurality of pushbuttons mounted on said base along a front edge thereof for movement relative to said base, first and second turn plates mounted on said base for rotation about first and second axes, respectively, said first and second axes being substantially perpendicular to the plane of said base, first and second generally comb-shaped link members each extending between said first and second turn plates and having opposite ends pivotally connected thereto, an auxiliary link member interconnecting said first and second turn plates to form a link work together with said first and second comb-shaped link members and said first and second turn plates, said link work extending substantially parallel to the plane of said base, said auxiliary link member being pivotally connected to each of said first and second turn plates at a point positioned at the apex of a triangle having its bottom side formed by a line joining the points of which said first and second comb-shaped link members are pivotally connected to each turn plate, said first and second comb-shaped link members and said auxiliary link member being substantially parallel with respect to each other and with said row of pushbuttons, said first and second comb-shaped link members being closely spaced in a direction perpendicular to the plane of said base and movable toward and away from said row of pushbuttons, each of said first and second comb-shaped link members having a plurality of spaced projections extending toward said row of pushbuttons substantially parallel with the plane of said base, said pushbuttons having stems laterally spaced from each other and extending substantially transversely of a group of said first and second comb-shaped link members and said auxiliary link member through a space between said base and said group, each of said pushbutton stems carrying a generally flat regulating member normally fixed to an associated pushbutton stem and extending in a plane substantially parallel to said link work, said regulating member having first and second projections disposed on opposite sides of an associated pushbutton stem, said regulating member being movable toward said first and second comb-shaped link members when an associated pushbutton is pushed, said first and second comb-shaped link members and the regulating member on each pushbutton stem being arranged such that one of the projections of said first comb-shaped link member and one of the projections of said comb-shaped link member are positioned in paths of movement of said first and second projections of said regulating member whereby said first and second projections of said regulating member are moved into engagement with corresponding projections of said first and second comb-shaped link members when an associated pushbutton is pushed to thereby move said link work relative to said base, and a plurality of variable elements operatively connected to said link work and movable relative to said tuning elements to obtain a tuned state.

4. A pushbutton tuner according to claim 3, wherein the projections of said first comb-shaped link member extend therefrom substantially to a first straight line extending between the points at which said first comb-shaped link member is pivotally connected to said first and second turn plates and the projections of said second comb-shaped link member extend therefrom substantially to a second straight line extending between the points at which said second comb-shaped link member is pivotally connected to said first and second turn plates.

5. A pushbutton tuner according to claim 3, further including a rotary tuning mechanism including a tuning shaft mounted on said base for rotation about a third axis generally parallel to said pushbutton stems, a rotary tuning mechanism mounting plate mounted on said base for rotation about a fourth axis substantially parallel to said first and second axes, a disc member mounted on said tuning mechanism mounting plate for rotation about a fifth axis substantially parallel to said fourth axis, and transmission means on said tuning mechanism mounting plate for drivingly connecting said tuning shaft to said disc member; one of said turn plates having a generally arcuate portion, said disc member being movalbe into and out of driving engagement with said arcuate portion of said one turn plate; an elongated member operatively connected at one end to said tuning mechanism mounting plate and extending over said pushbutton stems substantially transversely thereof, said pushbutton stems carrying cams thereon, respectively, said elongated member having cam followers each operatively associated with one of said cams, the arrangement being such that when a pushbutton is pushed, said elongated member is moved to rotate said tuning mechanism mounting plate about said fourth axis in a direction to move said disc member out of engagement with said one turn plate; and a spring member always biasing said tuning mechanism mounting plate about said fourth axis in the opposite direction.

* * * * *